(12) United States Patent
Yang et al.

(10) Patent No.: US 9,355,979 B2
(45) Date of Patent: May 31, 2016

(54) ALIGNMENT STRUCTURES AND METHODS OF FORMING SAME

(71) Applicant: Taiwan Semiconductor Manufacturing Company, Ltd., Hsin-Chu (TW)

(72) Inventors: Ching-Jung Yang, Pingzhen (TW); Hsien-Wei Chen, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 13/969,027

(22) Filed: Aug. 16, 2013

(65) Prior Publication Data
US 2015/0048498 A1 Feb. 19, 2015

(51) Int. Cl.
H01L 23/00 (2006.01)
H01L 23/544 (2006.01)
(Continued)

(52) U.S. Cl.
CPC .............. *H01L 24/13* (2013.01); *H01L 23/544* (2013.01); *H01L 24/05* (2013.01); *H01L 21/565* (2013.01); *H01L 23/3192* (2013.01); *H01L 24/03* (2013.01); *H01L 24/11* (2013.01); *H01L 2223/5442* (2013.01); *H01L 2223/54426* (2013.01); *H01L 2223/54453* (2013.01); *H01L 2224/02331* (2013.01); *H01L 2224/0345* (2013.01); *H01L 2224/0347* (2013.01); *H01L 2224/0391* (2013.01); *H01L 2224/03452*
(Continued)

(58) Field of Classification Search
CPC ............................................ H01L 24/11–24/13
USPC ................................... 257/737; 438/113, 401
See application file for complete search history.

(56) References Cited

U.S. PATENT DOCUMENTS 6,635,567 B2 * 10/2003 Ebertseder et al. ........... 438/638
9,159,675 B2 * 10/2015 Han ...................... H01L 23/544
(Continued)

Primary Examiner — Christine Enad
(74) Attorney, Agent, or Firm — Slater Matsil, LLP

(57) ABSTRACT

Embodiments of the present disclosure include interconnect structures and methods of forming interconnect structures. An embodiment is a method of forming an interconnect structure, the method including forming a first post-passivation interconnect (PPI) over a first substrate, forming a second PPI over the first substrate, and forming a first conductive connector on the first PPI. The method further includes forming a second conductive connector on the second PPI, and forming a molding compound on top surfaces of the first and second PPIs and surrounding portions of the first and second connectors, a first section of molding compound being laterally between the first and second connectors, the first section of molding compound having a curved top surface.

21 Claims, 10 Drawing Sheets

(51) Int. Cl.
*H01L 23/31* (2006.01)
*H01L 21/56* (2006.01)

(52) U.S. Cl.
CPC ......... (2013.01); *H01L 2224/03462* (2013.01); *H01L 2224/0401* (2013.01); *H01L 2224/05008* (2013.01); *H01L 2224/05541* (2013.01); *H01L 2224/05569* (2013.01); *H01L 2224/05624* (2013.01); *H01L 2224/05639* (2013.01); *H01L 2224/05644* (2013.01); *H01L 2224/05647* (2013.01); *H01L 2224/05684* (2013.01); *H01L 2224/1134* (2013.01); *H01L 2224/131* (2013.01); *H01L 2224/13006* (2013.01); *H01L 2224/13023* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/14131* (2013.01); *H01L 2924/12042* (2013.01); *H01L 2924/181* (2013.01)

(56) References Cited

U.S. PATENT DOCUMENTS

| | | | |
|---|---|---|---|
| 2007/0117343 A1* | 5/2007 | Hwang et al. | 438/401 |
| 2007/0164432 A1* | 7/2007 | Wakisaka et al. | 257/737 |
| 2008/0284048 A1* | 11/2008 | Kim et al. | 257/797 |
| 2009/0096094 A1* | 4/2009 | Tetani et al. | 257/737 |
| 2010/0072635 A1* | 3/2010 | Kuo et al. | 257/797 |
| 2013/0037966 A1* | 2/2013 | Qiu et al. | 257/782 |

* cited by examiner

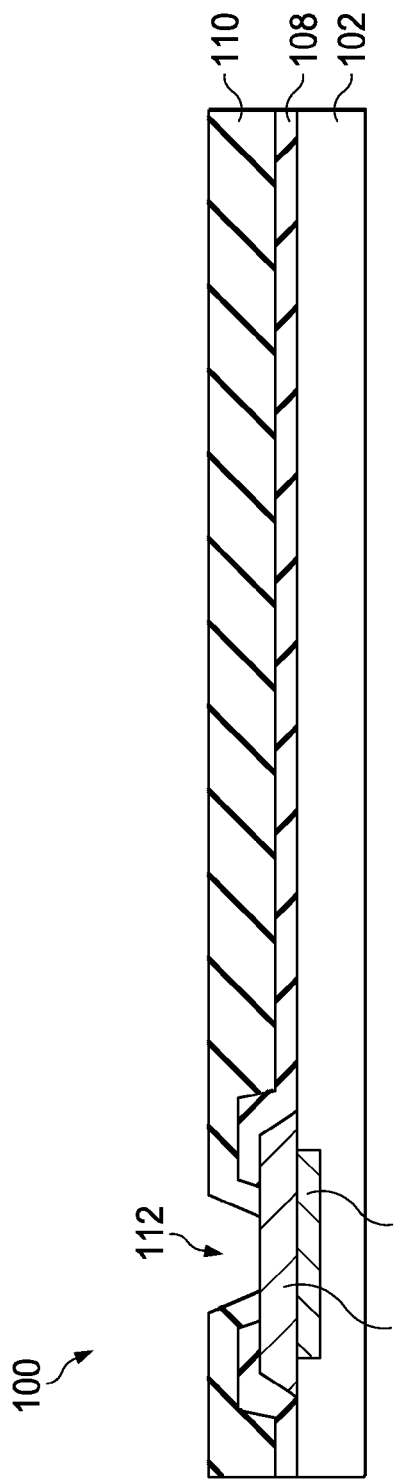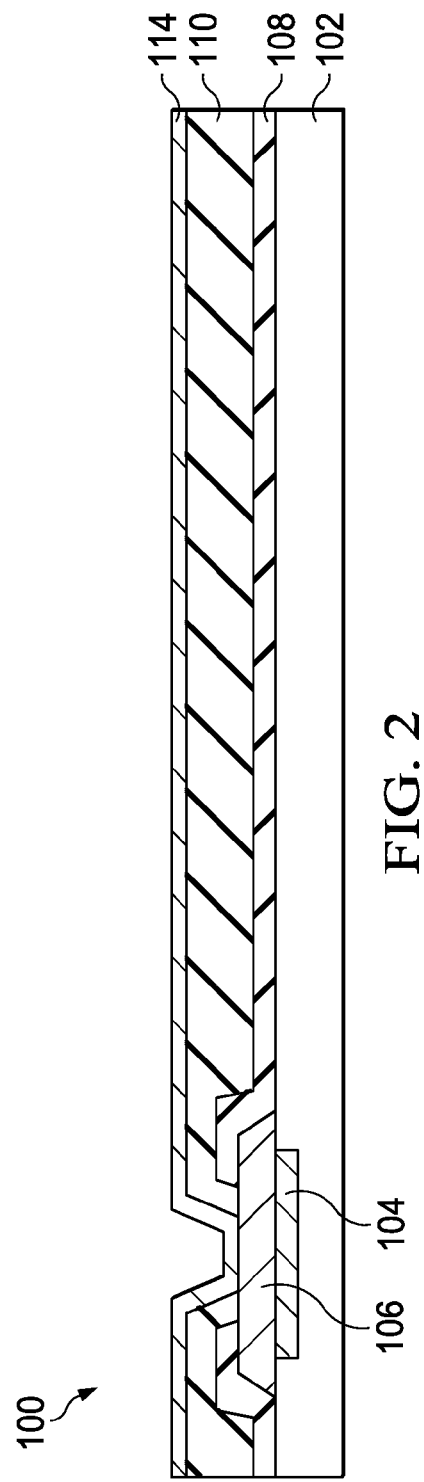

ALIGNMENT STRUCTURES AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Components of a package may be stacked using conductive connective structures to allow stacked components to communicate with each other, or with external components. For example, solder ball grid arrays are a technique sometimes used to join substrate, dies or packages, with an array of solder balls deposited on the bonding pads of a first substrate, and with a second substrate, die or package joined at its own bonding pad sites to the first pad via the solder balls. A molding compound or other supporting structures may be applied around the connecter structures to provide support, protection, and insulation. In some instances, the connectors and molding compound may be applied to the surface of dies formed on a wafer prior to the die being cut, or singulated for mounting on a board or carrier.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 8 illustrate cross-sectional views of intermediate stages in the manufacturing of an alignment structure in accordance with an embodiment;

DETAILED DESCRIPTION OF ILLUSTRATIVE EMBODIMENTS

Figure 3:
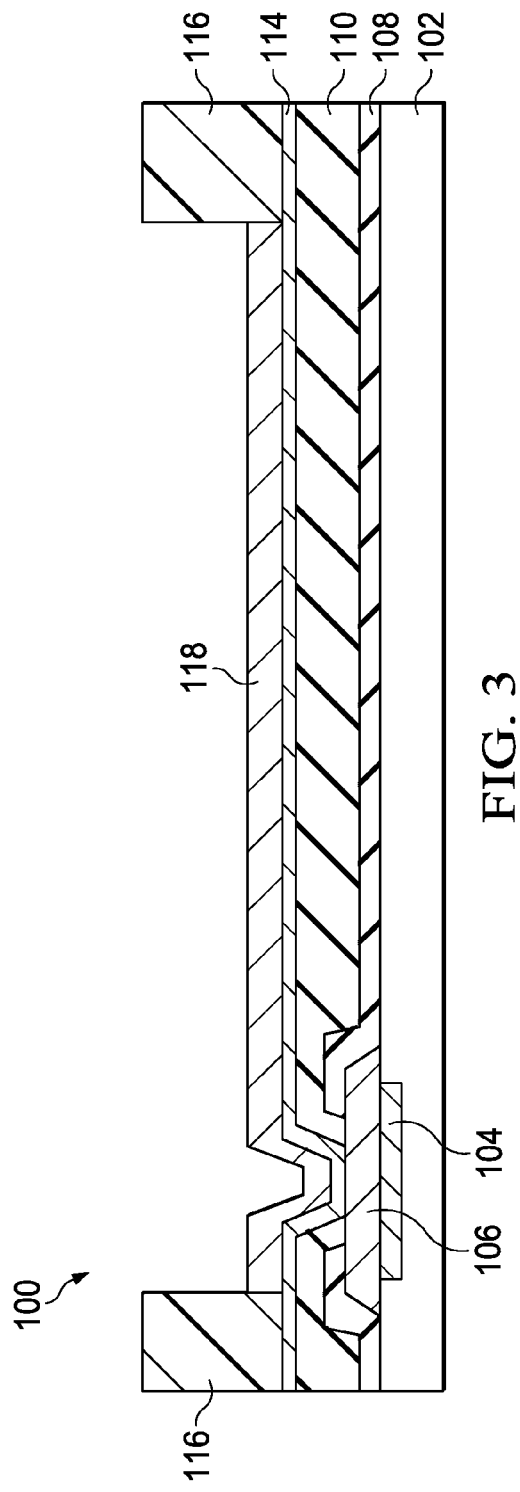

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely making and using alignment structures useful in, for example, wafer level chip scale package (WLCSP) assemblies. Other embodiments may also be applied, however, to substrates, packages, structures or devices or combinations of any type of integrated circuit device or component.

Figure 7:
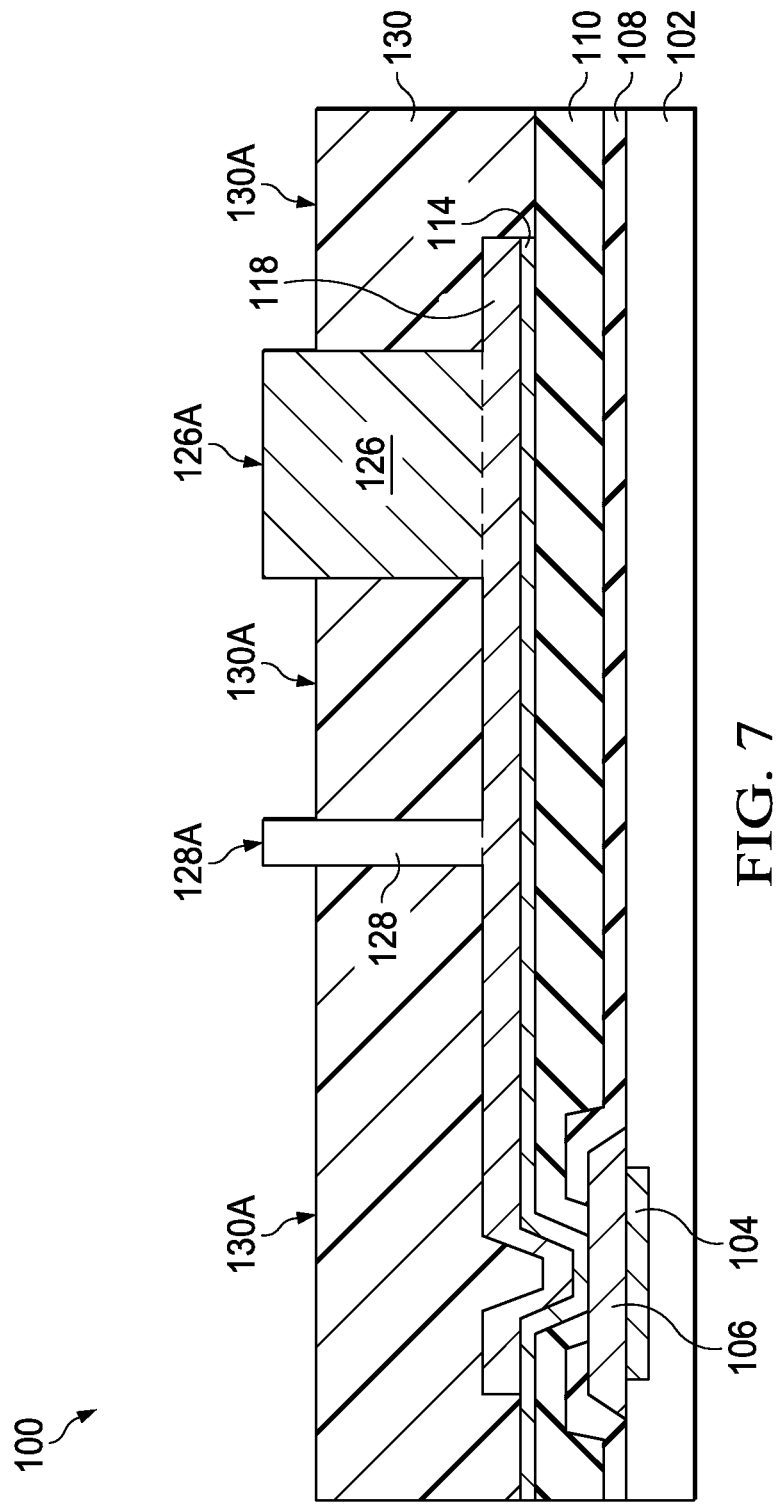
Figure 8:
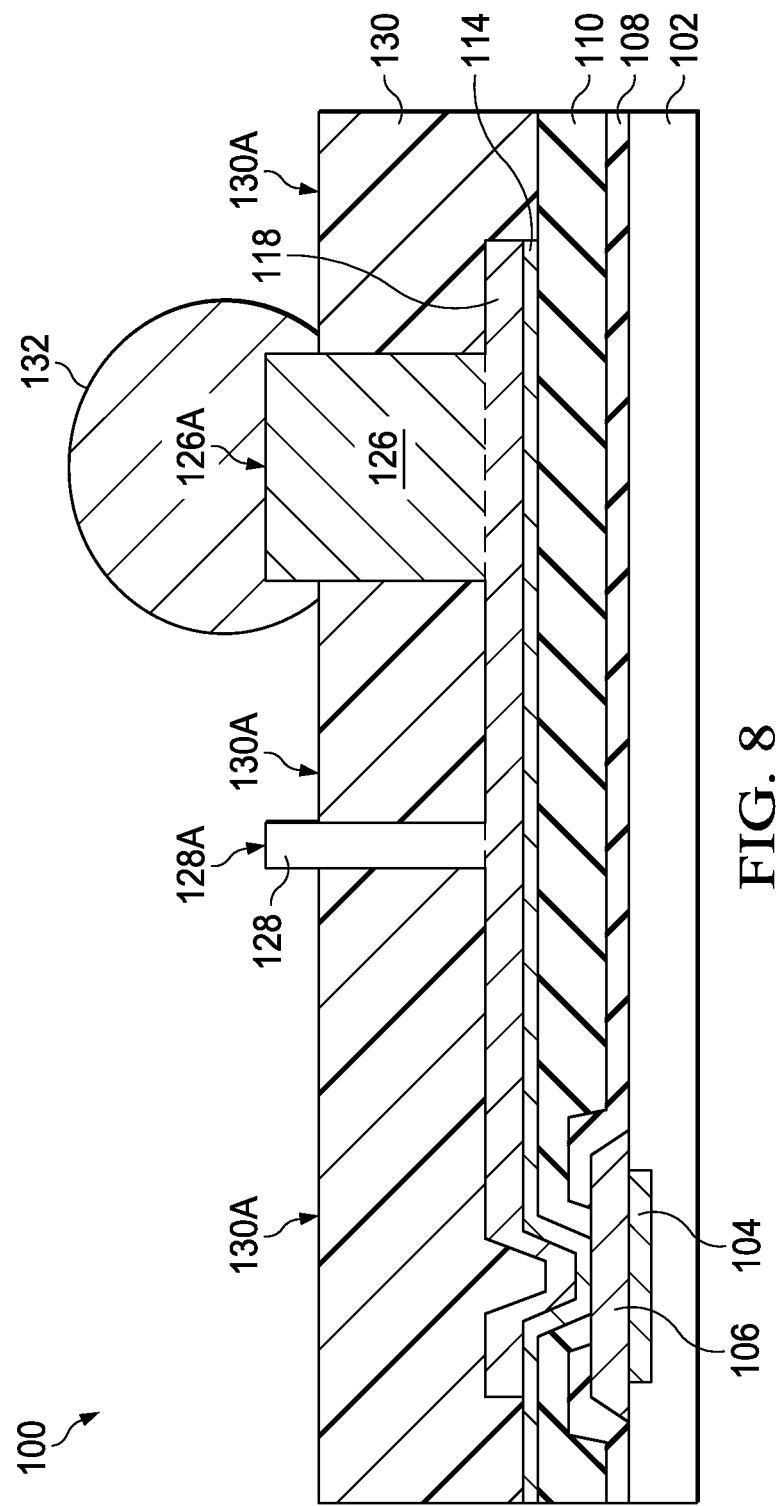
Figure 9:
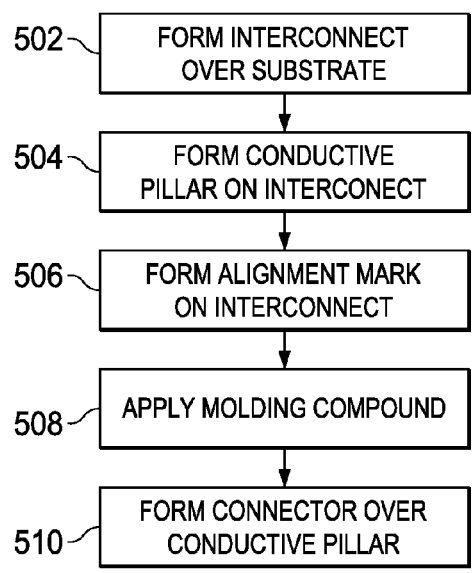
FIG. 9 illustrates a process flow of the process illustrated in FIGS. 1 through 8 in accordance with an embodiment.

FIGS. 1 through 8 are cross-sectional views of intermediate stages in the manufacturing of an alignment structure in accordance with an embodiment, and FIG. 9 is a process flow of the process shown in FIGS. 1 through 8.

FIG. 1 illustrates a semiconductor device 100 in an intermediate stage of manufacture. The semiconductor device 100 may include a substrate 102, metallization layers 104, a contact pad 106, a first passivation layer 108, and a second passivation layer 110. In an embodiment, the substrate 102 is a part of a wafer. The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 102 may include active and passive devices (not shown in FIG. 1). As one of ordinary skill in the art will recognize, a wide variety of devices such as transistors, capacitors, resistors, combinations of these, and the like may be used to generate the structural and functional requirements of the design for semiconductor device 100. The devices may be formed using any suitable methods. Only a portion of the substrate 102 is illustrated in the figures, as this is sufficient to fully describe the illustrative embodiments.

The substrate 102 may also include one or more metallization layers 104. The metallization layers 104 may be formed over the active and passive devices and are designed to connect the various devices to form functional circuitry. The metallization layers 104 may be formed of alternating layers of dielectric (e.g., low-k dielectric material) and conductive material (e.g., copper) and may be formed through any suitable process (such as deposition, damascene, dual damascene, or the like). Although FIG. 1 only illustrates one metallization layer 104, it is within the contemplated scope of the present disclosure that there may be more metallization layers included in the substrate 102.

The contact pad 106 may be formed over and in electrical contact with the metallization layers 104 in order to help provide external connections to the active and passive devices. The contact pad 106 may be made of aluminum, an aluminum alloy, copper, a copper alloy, nickel, the like, or a combination thereof. The contact pad 106 may be formed using a deposition process, such as sputtering, to form a layer of material (not shown). Portions of the layer of material may then be removed through a suitable process, such as photolithographic masking and etching, to form the contact pad 106. However, any other suitable process may be utilized to form contact pad 106. The contact pad 106 may be formed to have a thickness of between about 0.5 µm and about 4 µm.

A first passivation layer 108 may be formed on the substrate 102 and over the contact pad 106. The first passivation layer 108 may be made of one or more suitable dielectric materials such as silicon oxide, silicon nitride, a polymer such as polyimide, solder resist, polybenzoxazole (PBO), benzocyclobutene (BCB), molding compound, the like, or a combination thereof. The first passivation layer 108 may be formed by various processes such as a spin-on process, chemical vapor deposition (CVD), although any suitable process may be utilized. The first passivation layer 108 may have a thickness from about 0.5 µm and about 30 µm. In some embodiments, a top surface of contact pad 106 and a portion of a bottom surface of the first passivation layer 108 are substantially level.

After the first passivation layer 108 has been formed, an opening may be formed through the first passivation layer 108 to expose at least a portion of the underlying contact pad 106. This opening through the first passivation layer 108 to expose the portion of the underlying contact pad 106 allows for physical and electrical contact between the contact pad 106 and the PPI 118 (discussed further below). The opening through the first passivation layer 108 may be formed using a suitable photolithographic mask and etching process, although any other suitable process to expose portions of the contact pad 106 may alternatively be used.

The second passivation layer 110 may be formed over the contact pad 106 and the first passivation layer 108. The second passivation layer 110 may be formed of similar materials and by similar processes as the first passivation layer 108 described above and the description will not be repeated herein, although the first passivation layer 108 and the second passivation layer 110 need not be the same. The second passivation layer 110 may be formed to have a thickness from about 2 µm and about 30 µm.

After the second passivation layer 110 has been formed, an opening 112 through the second passivation layer 110 to expose at least a portion of the underlying contact pad 106 may be made. The opening 112 through the second passivation layer 110 to the underlying contact pad 106 allows for physical and electrical contact between the contact pad 106 and the subsequently formed seed layer 114 (discussed further below). The opening 112 through the second passivation layer 110 may be formed using a suitable photolithographic mask and etching process, although any suitable process to expose portions of the contact pad 106 may be used.

After the opening through the second passivation layer 110 has been formed, a seed layer 114 is conformally deposited on the second passivation layer 110 and in the opening 112 as illustrated in FIG. 2. The seed layer 114 may be formed by physical vapor deposition (PVD), CVD, atomic layer deposition (ALD), the like, or a combination thereof. The seed layer 114 may be made of titanium, copper, tantalum, tungsten, nitrides or oxynitrides thereof, the like, or a combination thereof.

After the seed layer 114 is formed, a post-passivation interconnect (PPI) 118 is formed (step 502) as illustrated in FIG. 3. The PPI 118 is formed to extend through the second passivation layer 110 and to extend along the second passivation layer 110. The PPI 118 may provide electrical connection between the contact pad 106 and the subsequently formed connector 132 (see FIG. 8). The conductive material of the PPI 118 may be deposited over the seed layer 114 and in the opening 112. The conductive material may be formed by an electro-chemical plating process, CVD, ALD, PVD, the like, or a combination thereof. In an embodiment, the conductive material of the PPI 118 is made of copper, tungsten, aluminum, silver, gold, the like, or a combination thereof. In some embodiments, a photo resist 116 is formed and patterned on the seed layer 114 and then the PPI 118 is formed in the patterned photo resist 116. The photoresist 116 may be formed by a wet process, such as a spin-on process, or by a dry process, such as by applying a dry film. In other embodiments, the photo resist is omitted and the conductive material is formed on the seed layer 114 and then patterned to form the PPI 118.

Figure 4:
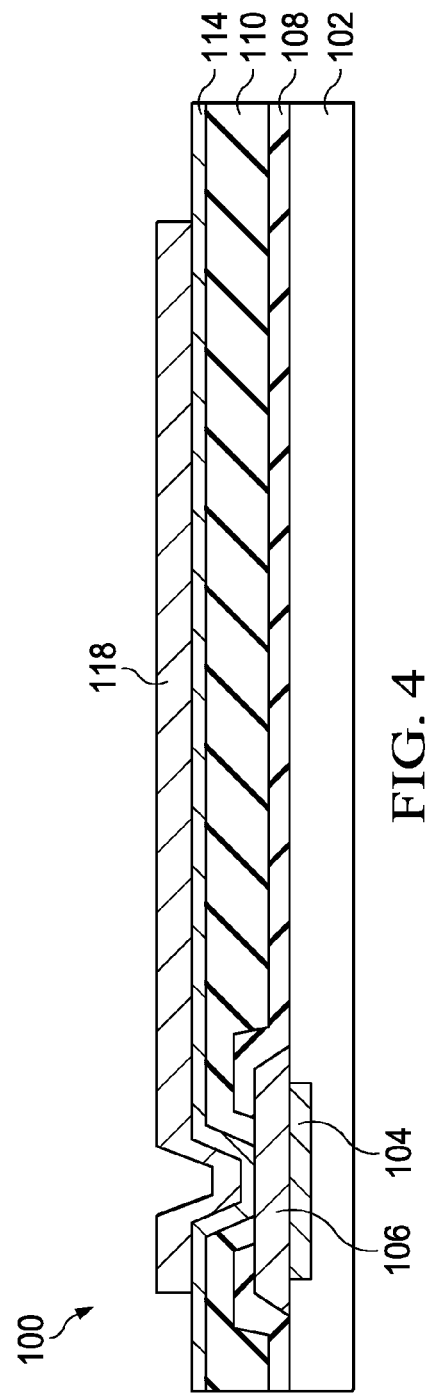

FIG. 4 illustrates the removal of the photoresist 116. The photoresist 116 may be removed through a suitable removal process such as ashing or an etch process.

Figure 5:
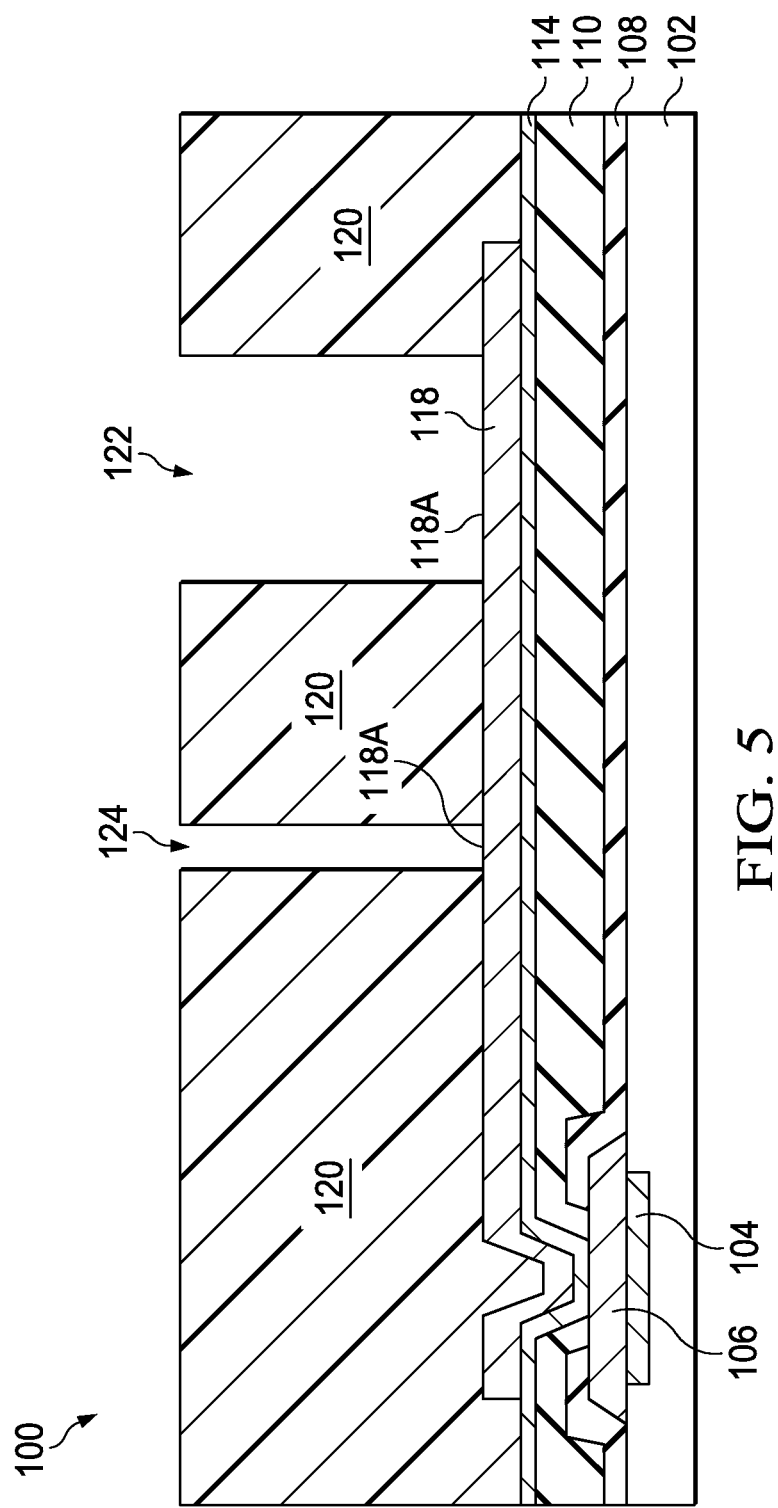

FIG. 5 illustrates the forming and patterning of a photoresist over the PPI 118 and the seed layer 114. The photoresist 120 may be formed by a wet process, such as a spin-on process, or by a dry process, such as by applying a dry film. The photoresist 120 is patterned to form openings 122 and 124 exposing a top surface 118A of the PPI 118 in the openings 122 and 124. Although a single opening 124 and a single opening 122 are illustrated in FIG. 5, there may be more openings 122 and/or 124 depending on the design of the semiconductor device 100.

Figure 6:
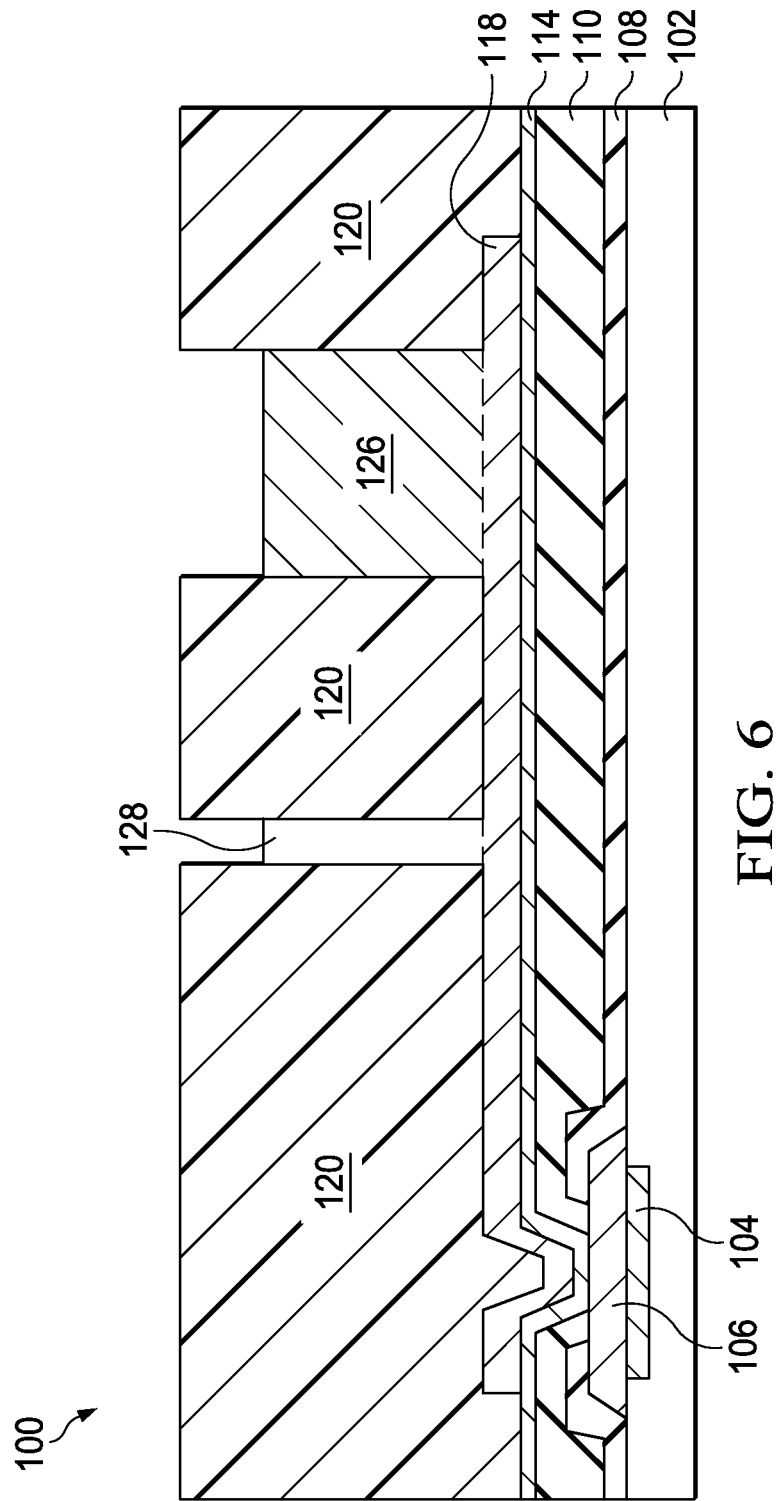

FIG. 6 illustrates the formation of a conductive pillar 126 on the PPI 118 (step 504) and the formation of an alignment structure 128 on the PPI 118 (step 506). The conductive pillar 126 provides electrical connection between the PPI 118 and the subsequently formed connector 132 (see FIG. 8). The alignment structure 128 provides for alignment of substrate 102 after the substrate 102 is covered by a molding material (see molding compound 130 in FIGS. 7 and 8) during the sawing process to singulate the wafer into multiple dies (e.g. dies 200 and 300 in FIGS. 11 through 13). The conductive material of the conductive pillar 126 and the alignment structure 128 may be deposited on the PPI 118 in the openings 122 and 124, respectively. The conductive material may be formed by an electro-chemical plating process, CVD, ALD, PVD, the like, or a combination thereof. In an embodiment, the conductive material of the conductive pillar 126 and the alignment structure 128 is made of copper, tungsten, aluminum, silver, gold, the like, or a combination thereof. In some embodiments, the conductive pillar 126 and the alignment structure 128 are formed at a same time by a same process. In other embodiments, the conductive pillar 126 and the alignment structure 128 are formed at different times by different processes. In an embodiment, the PPI 118, the conductive pillar 126, and the alignment structure 128 have a same material composition.

FIG. 7 illustrates the removal of the photoresist 120 and the formation of a molding compound 130 (step 508) on the PPI 118 and the second passivation layer 110 and surrounding the conductive pillar 126 and the alignment structure 128. The molding compound 130 may protect the conductive pillar 126 and the underlying PPI 118 from subsequent processing. In an embodiment, the molding compound 130 is a nonconductive material, such as an epoxy, a resin, polyimide, polybenzoxazole (PBO), benzocyclobutene (BCB), a silicone, an acrylate, the like, or a combination thereof. In some embodiments, the molding compound 130 is dispensed in a liquid form. In some embodiments, the molding compound 130 may be formed to have a top surface 130A below top surfaces 126A and 128A of the conductive pillar 126 and the alignment structure 128, respectively. In another embodiment, the top surfaces 130A, 128A, and 126A are substantially level.

In an embodiment, the molding compound 130 is pressure molded by a molding layer (not shown) and a release layer (not shown). The release layer may be made of ethylene tetrafluoroethylene (ETFE), polytetrafluoroethylene (PTFE), the like, or a combination thereof. The molding compound 130 may be shaped by the molding layer. The molding process may cause more of the conductive pillar 126 and the alignment structure 128 to extend above the top surface 130A of the molding compound 130. In some embodiments, the top surface 130A of the molding compound 130 is curved after the molding process.

In some embodiments, the molding compound 130 is applied while substantially liquid, and then may be cured through a chemical reaction, such as in an epoxy or resin. In some other embodiments the molding compound 130 is an ultraviolet (UV) cured polymer applied as a gel or malleable solid capable of being disposed on the PPI 118 and second passivation layer 110 and around or conforming to the surfaces of the conductive pillar 126 and the alignment structure 128.

FIG. 8 illustrates the formation of connector 132 (step 510) on the conductive pillar 126. As illustrated, the alignment structure 128 does not have a connector formed over it to allow for the alignment structure 128 to be visible during the singulation process. The connector 132 may be a solder ball, a micro bump, a metal pillar, a controlled collapse chip connection (C4) bump, an electroless nickel-electroless palladium-immersion gold technique (ENEPIG) formed bump, or the like. The connector 132 may be made of a conductive material such as solder, copper, aluminum, gold, nickel, silver, palladium, tin, the like, or a combination thereof. In an embodiment in which the connector 132 is a solder bump, the connector 132 is formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shape. In some embodiments, a metal cap layer (not shown) is formed on the top of the conductive pillar 126 before the connector 132 is formed on the metal cap layer. The metal cap layer may include nickel, tin, tin-lead, gold, silver, palladium, indium, nickel-palladium-gold, nickel-gold, the like, or a combination thereof and may be formed by a plating process.

The number of conductive pillars 126, alignment structures 128, and connectors 132 in FIG. 8 are only for illustrative purposes and are not limiting. There could be any suitable number of conductive pillars 126, aligning structures 128, and connectors 132.

Figure 10A:
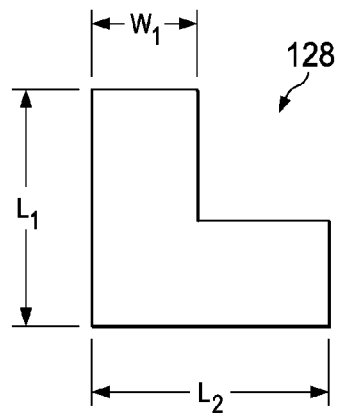
FIGS. 10A through 10C illustrate top-views of alignment structures in accordance with embodiments.
Figure 10B:
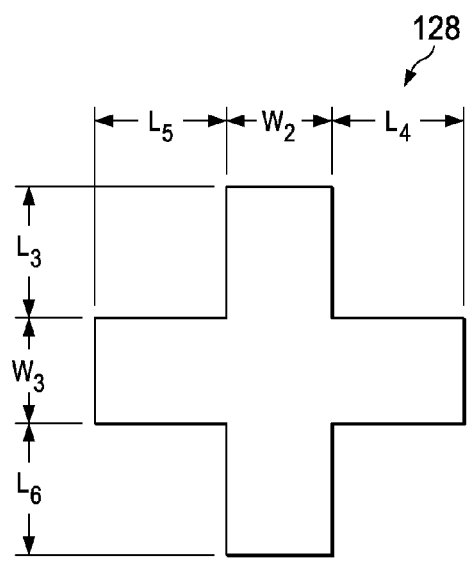
Figure 10C:
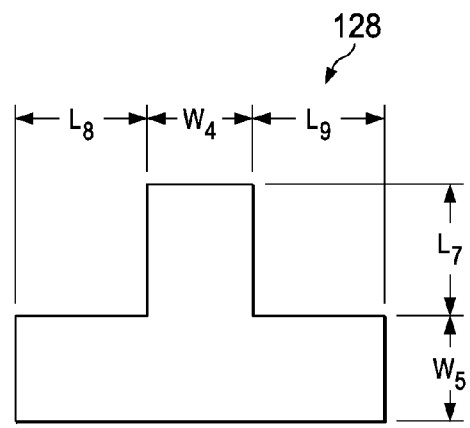

FIGS. 10A through 10C illustrate top-views of alignment structures 128 in accordance with embodiments. FIG. 10A illustrates an L-shaped alignment structure 128 with portions extending in a first direction and a second direction, with the first direction being substantially perpendicular to the second direction. The alignment structure 128 has a width $W_1$, a length $L_1$ of a first portion, and a length $L_2$ of a second portion. In some embodiments, the width $W_1$, the length $L_1$, and the length $L_2$ are each from about 20 μm to about 50 μm.

FIG. 10B illustrates a plus-shaped alignment structure 128 which extends in four directions with two portions overlapping each other in each of their respective middle regions and the two portions being substantially perpendicular to each other. The first portion has a width $W_2$ and lengths $L_3$ and $L_6$ extending in opposite directions from the second portion. The second portion has a width $W_3$ and lengths $L_4$ and $L_5$ extending in opposite directions from the first portion. In some embodiments, the widths $W_2$ and $W_3$ and the lengths $L_3$, $L_4$, $L_5$, and $L_6$ are each from about 20 μm to about 50 μm.

FIG. 10C illustrates a T-shaped alignment structure 128 which extends in three directions with two portions overlapping each other and the two portions being substantially perpendicular to each other. The first portion has a width $W_4$ and a length $L_7$ extending from the second portion. The second portion has a width $W_5$ and lengths $L_8$ and $L_9$ extending in opposite directions from the first portion. In some embodiments, the widths $W_4$ and $W_5$ and the lengths $L_7$, $L_8$, and $L_9$ are each from about 20 μm to about 50 μm. Although FIGS. 10A through 10C illustrate three shapes for an alignment structure 128, any shape of the alignment structure 128 such as a rectangle, a square, a triangle, a hexagon, or the like is within the contemplated scope of the present disclosure.

Figure 11:
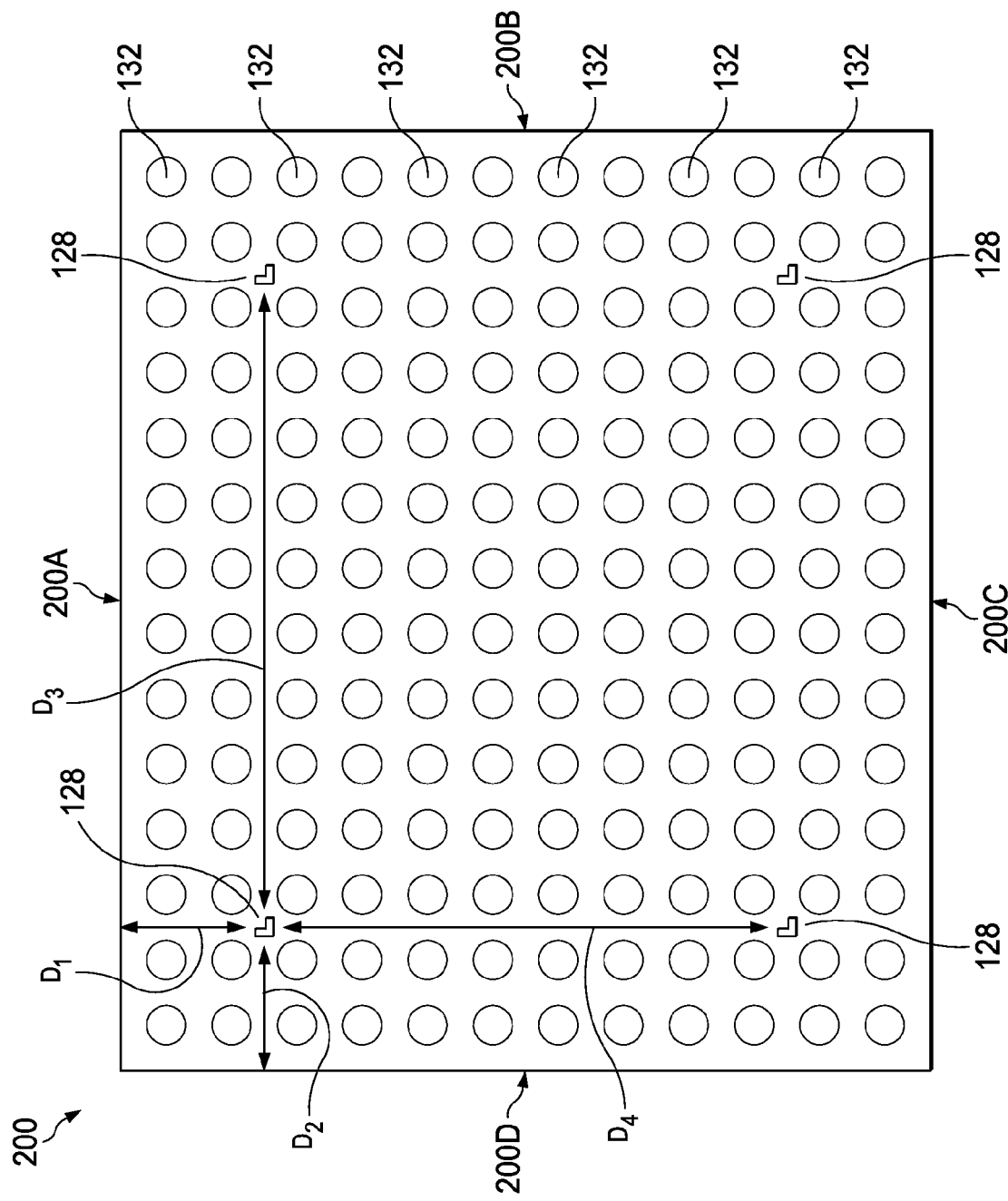
FIG. 11 illustrates a top-view of a die with alignment structures in accordance with an embodiment.

FIG. 11 illustrates a top-view of a die 200 with alignment structures 128 and connectors 132 in accordance with an embodiment. The die 200 has four sides 200A, 200B, 200C, and 200D and four alignment structures 128. The sides 200A and 200C being opposite each other and substantially parallel and sides 200B and 200D being opposite each other and substantially parallel. In some embodiments, the sides 200A and 200C are substantially perpendicular to the sides 200B and 200D. Each of the alignment structures 128 are a distance $D_1$ from a first side (e.g. side 200A in FIG. 11) of the die 200, a distance $D_2$ from a second side (e.g. side 200D in FIG. 11) of the die 200, a distance $D_3$ from a first adjacent alignment structure 128, and a distance $D_4$ from a second adjacent alignment structure 128. In some embodiments, the distances $D_1$, $D_2$, $D_3$, and $D_4$ are greater than or equal to about 200 μm. In an embodiment, each of the distances $D_1$ and $D_2$ are less than each of the distances $D_3$ and $D_4$. In some embodiments, the alignment structures 128 have at least one side that is substantially parallel to a side (200A, 200B, 200C, or 200D) of the die 200.

Figure 12:
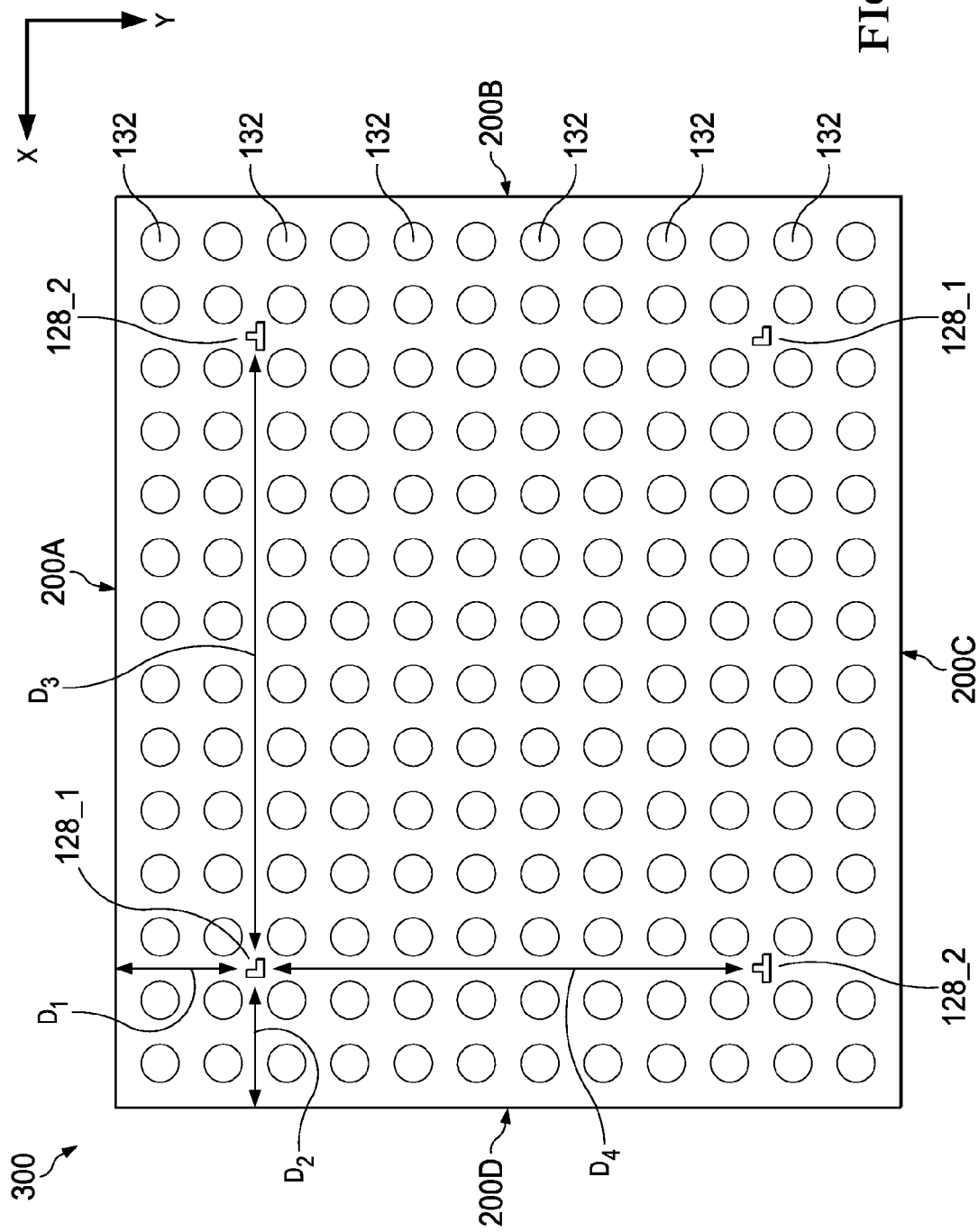
FIG. 12 illustrates a top-view of a die with alignment structures in accordance with another embodiment.

FIG. 12 illustrates a top-view of a die 300 with more than one configuration of alignment structure 128 (128_1 and 128_2 in FIG. 12). In some embodiments, the alignment structures 128_1 are located near opposite corners of the die 300 and are both L-shaped alignment structures 128 as illustrated in FIG. 10A, and the alignment structures 128_2 are located near opposite corners of the die 300 and are T-shaped alignment structures as illustrated in FIG. 10C. In an embodiment, the alignment structures 128_1 are used to align the die 300 in the X-direction and the alignment structures 128_2 are used to align the die 300 in the Y-direction. In another embodiment, the alignment structures 128_1 are used to align the die 300 in the Y-direction and the alignment structures 128_2 are used to align the die 300 in the X-direction. In another embodiment, the alignment structures 128_1 and 128_2 are both used to align the die 300 in the X-direction and the Y-direction. In some embodiments, the alignment structures 128_1 and 128_2 have at least one side that is substantially parallel to a side (200A, 200B, 200C, or 200D) of the die 300.

Figure 13:
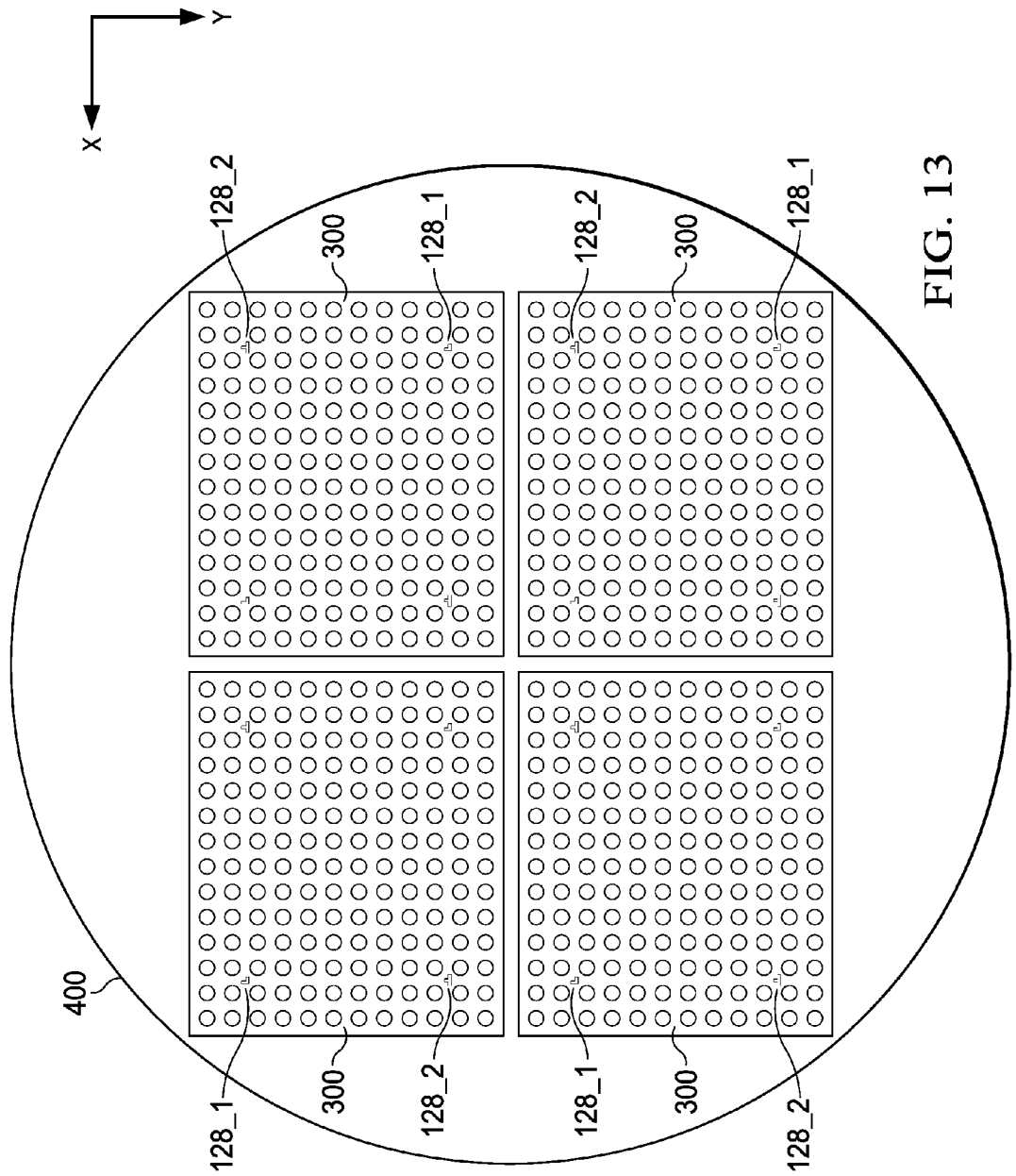
FIG. 13 illustrates a top-view of multiple dies with alignment structures in accordance with an embodiment.

FIG. 13 illustrates a top-view of a wafer 400 with multiple dies 300 on the wafer 400 and each die 300 having alignment structures 128 (128_1 and 128_2 in FIG. 13) in accordance with an embodiment. In an embodiment, the dies 300 were formed from a single wafer 400 and were singulated by a cutting apparatus using the alignment structures 128 to align the wafer and the cutting apparatus during the cutting process. In some embodiments, the cutting apparatus includes a laser saw, a die saw, the like, or a combination thereof to cut through the substrate 102 to separate the dies 300.

It has been found that the molding compound surrounding the conductive pillar and covering the underlying PPI protects and insulates those structures from subsequent processing. Also, applying the molding compound before the dies are singulated is more cost effective and provides better protection to the underlying structures than applying the molding compound after the singulation of the dies. However, the molding compound covers any marks or scribe lines on the wafer/dies and thus the alignment structures extending above the molding compound allow proper alignment of wafer/dies during the singulation process.

An embodiment is a method of forming an interconnect structure, the method including forming a first post-passivation interconnect (PPI) over a first substrate, forming a second PPI over the first substrate, and forming a first conductive connector on the first PPI. The method further includes forming a second conductive connector on the second PPI, and forming a molding compound on top surfaces of the first and second PPIs and surrounding portions of the first and second connectors, a first section of molding compound being laterally between the first and second connectors, the first section of molding compound having a curved top surface.

Another embodiment is a method of forming an interconnect structure, the method includes forming a contact pad on a top surface of a first substrate, forming a first passivation layer on the top surface of the first substrate, the first passivation layer being on a portion of a top surface of the contact pad, and forming a second passivation layer on the first passivation layer, the second passivation layer being on a portion of the top surface of the contact pad. The method further includes forming a first post-passivation interconnect (PPI) contacting the top surface of the contact pad and extending along the top surface of the second passivation layer, forming a first connector on the first PPI, depositing a molding compound over the second passivation layer, the first PPI, and the first connector, and applying a pressure mold to the molding compound, the molding compound having a concave meniscus top surface after the applying the pressure mold, the concave meniscus top surface has a concavity length from about 10 µm to about 50 µm.

A further embodiment is an interconnect structure including a first post-passivation interconnect (PPI) over a first substrate, a first conductive connector on the first PPI, a second PPI over the first substrate, and a second conductive connector on the second PPI. The interconnect structure further includes a molding compound on top surfaces of the first and second PPIs and surrounding portions of the first and second connectors, a first section of molding compound being laterally between the first and second connectors, the first section of molding compound having a curved top surface.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a post-passivation interconnect (PPI) over a substrate;
   forming a conductive pillar on the PPI;
   forming an alignment structure on the PPI, the alignment structure being electrically connected to the conductive pillar; and
   after the forming the conductive pillar and the forming the alignment structure, forming a molding compound in physical contact with a top surface of the PPI and surrounding portions of the conductive pillar and the alignment structure.

2. The method of claim 1 further comprising:
   forming a connector on a top surface of the molding compound, the connector being coupled to the conductive pillar.

3. The method of claim 1 further comprising:
   aligning the substrate with a cutting apparatus using the alignment structure; and
   cutting the substrate and the molding compound with the cutting apparatus.

4. The method of claim 1, wherein top surfaces of the alignment structure and the conductive pillar extend above a top surface of the molding compound.

5. The method of claim 1, wherein a first side of the alignment structure is substantially parallel with a second side of the substrate.

6. The method of claim 1, wherein the steps of forming the conductive pillar on the PPI and forming the alignment structure on the PPI are performed at a same time.

7. The method of claim 1, wherein the alignment structure comprises copper, tungsten, aluminum, silver, gold, or a combination thereof.

8. The method of claim 1, wherein the steps of forming the conductive pillar on the PPI and forming the alignment structure on the PPI comprise:
   forming a photoresist over the PPI;
   patterning the photoresist to have a first opening and a second opening; and
   performing a plating process to form the alignment structure in the first opening and the conductive pillar in the second opening.

9. The method of claim 1, wherein the conductive pillar has a first width and the alignment structure has a second width, the first width being greater than the second width.

10. The method of claim 3, wherein after the cutting the substrate and the molding compound with the cutting apparatus, the conductive pillar and the alignment structure are on a same die.

11. A method of forming a semiconductor device, the method comprising:
   providing a substrate having a plurality of dies;
   forming a plurality of post-passivation interconnects (PPIs) over the substrate, each of the plurality of dies having at least one PPI;
   forming a plurality of conductive pillars over the substrate, each of the plurality of dies having at least two conductive pillars;
   forming a plurality of alignment structures over the substrate, each of the plurality of dies having at least two alignment structures, one of the at least two alignment structures being electrically coupled to one of the at least two conductive pillars;

depositing a molding compound over the plurality of dies, the molding compound surrounding portions of each of the plurality of conductive pillars and the plurality of alignment structures;

aligning the substrate with a cutting apparatus using the plurality of alignment structures; and cutting the substrate into the plurality of dies, the electrically coupled one of the at least two alignment structures and one of the at least two conductive pillars being on a same die after the cutting the substrate.

12. The method of claim 11, wherein the steps of forming the plurality of conductive pillars over the substrate and forming the plurality of alignment structures over the substrate are performed at a same time by a same process.

13. The method of claim 11 further comprising:

forming a plurality of connectors over the substrate, each of the connectors being coupled to at least one of the plurality of conductive pillars, the connectors contacting a top surface of the molding compound.

14. The method of claim 11, wherein at least two of the plurality of conductive pillars and at least two of the plurality of alignment structures have top surfaces extending above a top surface of the molding compound.

15. The method of claim 11, wherein at least two of the plurality of conductive pillars have top surfaces coplanar with top surfaces of at least two of the plurality of alignment structures.

16. The method of claim 11, wherein at least two of the PPIs, at least two of the plurality of conductive pillars, and at least two of the plurality of alignment structures have a same material composition.

17. The method of claim 11 wherein at least two of the plurality of alignment structures have a first shape, and wherein at least two of the plurality of alignment structures have a second shape, the second shape being different than the first shape.

18. A method of forming a semiconductor device, the method comprising:

forming a contact pad over a substrate;

depositing a passivation layer over the contact pad and the substrate;

etching an opening in the passivation layer to expose at least a portion of the contact pad;

depositing a seed layer on the passivation layer and in the opening;

forming a conductive interconnect over the seed layer and in the opening, the conductive interconnect extending through the passivation layer and along a top surface of the passivation layer;

forming a conductive pillar over the conductive interconnect, the conductive pillar having a first bottom surface and a first top surface;

forming an alignment structure over the conductive interconnect and adjacent the conductive pillar, wherein the alignment structure is laterally spaced between the opening and the conductive pillar, the alignment structure having a second bottom surface and a second top surface, wherein the conductive pillar and the alignment structure are formed at a same time by a same process;

forming a molding compound over the conductive interconnect and surrounding portions of the conductive pillar and the alignment structure, the molding compound being in physical contact with a top surface of the conductive interconnect;

aligning the substrate with a cutting apparatus using the alignment structure; and cutting the substrate and the molding compound with the cutting apparatus, the conductive pillar and the alignment structure being on a same die after the cutting the substrate and the molding compound with the cutting apparatus.

19. The method of claim 18, wherein the first top surface and the second top surface are substantially coplanar, and wherein the first bottom surface and the second bottom surface are substantially coplanar.

20. The method of claim 18 further comprising:

forming a conductive connector on a top surface of the molding compound, the conductive connector being coupled to the conductive pillar, and the conductive pillar being electrically connected to the alignment structure.

21. The method of claim 18, wherein the forming the molding compound is performed after the forming the conductive pillar and the forming the alignment structure.

* * * * *